(12) United States Patent
Park et al.

(10) Patent No.: US 12,701,910 B2
(45) Date of Patent: Aug. 4, 2026

(54) FLEXIBLE DISPLAY APPARATUS

(71) Applicant: LG Display Co., Ltd., Seoul (KR)

(72) Inventors: JooHye Park, Anyang-si (KR);
Keunyoung Kim, Seoul (KR); **Sejin
Jang, Paju-si (KR); HyeongMin Jeon**,
Seoul (KR); Heeyeon Hwang,
Hanam-si (KR)

(73) Assignee: LG Display Co., Ltd., Seoul (KR)

( * ) Notice: Subject to any disclaimer, the term of this
patent is extended or adjusted under 35
U.S.C. 154(b) by 406 days.

(21) Appl. No.: 18/398,487

(22) Filed: Dec. 28, 2023

(65) Prior Publication Data

US 2024/0224774 A1 Jul. 4, 2024

(30) Foreign Application Priority Data

Dec. 29, 2022 (KR) ........................ 10-2022-0189088
Nov. 20, 2023 (KR) ........................ 10-2023-0161609

(51) Int. Cl.
*H10K 77/10* (2023.01)
*H10K 59/80* (2023.01)
*H10K 102/00* (2023.01)

(52) U.S. Cl.
CPC ....... *H10K 77/111* (2023.02); *H10K 59/8722*
(2023.02); *H10K 59/873* (2023.02); ***H10K
59/8792*** (2023.02); *H10K 2102/311* (2023.02);
*H10K 2102/351* (2023.02)

(58) Field of Classification Search
CPC ............. H10K 77/111; H10K 59/8722; H10K
59/873; H10K 59/8792; H10K 2102/311;
H10K 2102/351
See application file for complete search history.

(56) References Cited

U.S. PATENT DOCUMENTS

| | | | |
|---|---|---|---|
| 11,237,590 B2 | 2/2022 | Kim | |
| 2020/0159285 A1 | 5/2020 | Kim | |
| 2022/0037601 A1 | 2/2022 | Lee et al. | |
| 2022/0334290 A1 | 10/2022 | Kim et al. | |

FOREIGN PATENT DOCUMENTS

| | | |
|---|---|---|
| KR | 10-2019-0078226 A | 7/2019 |
| KR | 10-2020-0058634 A | 5/2020 |
| KR | 10-2022-0014626 A | 2/2022 |
| KR | 10-2022-0144724 A | 10/2022 |
| KR | 10-2023-0032603 A | 3/2023 |

*Primary Examiner* — Jay C Kim
*Assistant Examiner* — Woo K Lee
(74) *Attorney, Agent, or Firm* — Fenwick & West LLP

(57) ABSTRACT

A flexible display apparatus is disclosed. The flexible display apparatus includes a flexible substrate including a display area and a non-display area. The flexible display apparatus further includes an organic light-emitting element disposed on the flexible substrate. The flexible display apparatus further includes a cover member disposed on the organic light-emitting element, the cover member comprising at least one plate glass layer including a plate glass and an adhesive layer configured to cover the plate glass. The plate glass has a cusp at a lateral portion.

20 Claims, 9 Drawing Sheets

100

FLEXIBLE DISPLAY APPARATUS

CROSS-REFERENCE TO RELATED APPLICATIONS

This application claims the benefit of Republic of Korea Patent Application No. 10-2022-0189088, filed on Dec. 29, 2022, and Republic of Korea Patent Application No. 10-2023-0161609, filed on Nov. 20, 2023, each of which are hereby incorporated by reference in its entirety.

BACKGROUND

Field

The present disclosure relates to a flexible display apparatus, and more particularly to a flexible display apparatus that simultaneously improves folding or bending properties, impact resistance and flame retardancy while utilizing a cover member having a high surface hardness.

Description of the Related Art

Recently, a display field for visually expressing electrical information signals has been rapidly developed as the information age has come in earnest. Therefore, various display devices, which are thin in thickness and light in weight and have excellent performances such as low power consumption, have been developed. Specific examples of these display devices include a liquid crystal display device (LCD), a plasma display panel device (PDP), a field emission display device (FED), and an organic light emitting display device (OLED).

In recent years, the display devices have become increasingly diverse in shape and size, and there is a growing interest in flexible display device that can be folded or rolled to maintain display performance. In response to this interest, there has been a lot of research and development into panels, fixtures, and cover windows with specific radius of curvature.

In particular, the cover window is a component that is visible to users from the outside of the display device. Therefore, it is preferable to use a cover glass with good appearance characteristics rather than a plastic cover window. For example, because of the nature of the glass, excellent folding or bending properties may be obtained when a thickness is 0.1 mm or less. As another example, when the thickness of the glass is 0.35 mm or less, a flexible motion, which may be applied to vehicles, railroads, and aircraft, may be implemented.

However, even though the stiffness of glass itself is considerably better than plastic, as mentioned, the glass has less impact resistance at a limited thickness than the cover window made of plastic, which has more flexibility in thickness design. In addition, since it is quite difficult to realize folding or bending properties using the glass of general thickness, it is necessary to develop a technology for the cover window that can satisfy both impact resistance and folding or bending properties while having excellent surface properties. Further, there is also a need to develop a cover window that may satisfy flame retardancy and impact resistance to ensure safety even in extreme use environments such as a fire.

SUMMARY

An object to be achieved by the present disclosure is to provide a flexible display apparatus that can simultaneously satisfy impact resistance and folding or bending properties while using a cover member made of glass with excellent surface properties.

Another object to be achieved by the present disclosure is to provide a flexible display apparatus that may use a cover member made of glass and satisfy impact resistance, folding or bending properties, and flame retardancy.

Objects of the present disclosure are not limited to the above-mentioned objects, and other objects, which are not mentioned above, can be clearly understood by those skilled in the art from the following descriptions.

According to an aspect of the present disclosure, a flexible display apparatus includes: a flexible substrate including a display area and a non-display area; an organic light-emitting element disposed on the flexible substrate; and a cover member on the organic light-emitting element, the cover member comprising at least one plate glass layer including a plate glass and an adhesive layer configured to cover the plate glass, wherein the plate glass has a cusp formed on a lateral portion.

Other detailed matters of the exemplary embodiments are included in the detailed description and the drawings.

According to the present specification, it is possible to provide a flexible display apparatus having increased folding or bending properties and impact resistance while maintaining high surface properties of the glass itself by using the cover member including the thin plate glass having the cusp formed in the lateral portion.

According to the present specification, it is possible to improve surface durability, such as dent characteristics and puncture characteristics, of the cover member, by arranging an adhesive material having a high modulus to cover the top surface of the thin plate glass having the cusp formed in the lateral portion.

According to the present specification, it is possible to provide a flexible display apparatus having a high hardness shatterproof layer disposed on an upper portion of the thin plate glass, which minimizes breakage of the cover member due to external impact and suppresses scattering of fragments in the event of breakage.

According to the present specification, it is possible to provide the flexible display apparatus, in which the thin plate glass, which is foldable and bendable, satisfies the thickness condition capable of implementing flame retardancy, and the flexible display apparatus has improved impact resistance.

According to the present specification, the transparent flame-retardant film layer may be disposed on the upper portion of the thin plate glass having flame retardancy, thereby ensuring stability by significantly increasing the flame-retardant properties in the extreme use environment such as a fire.

According to the present specification, the thin plate glass, which has flame retardancy and the cusp at the lateral side, is covered by the adhesive layer having flame retardancy, thereby satisfying both flame retardancy and impact resistance.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
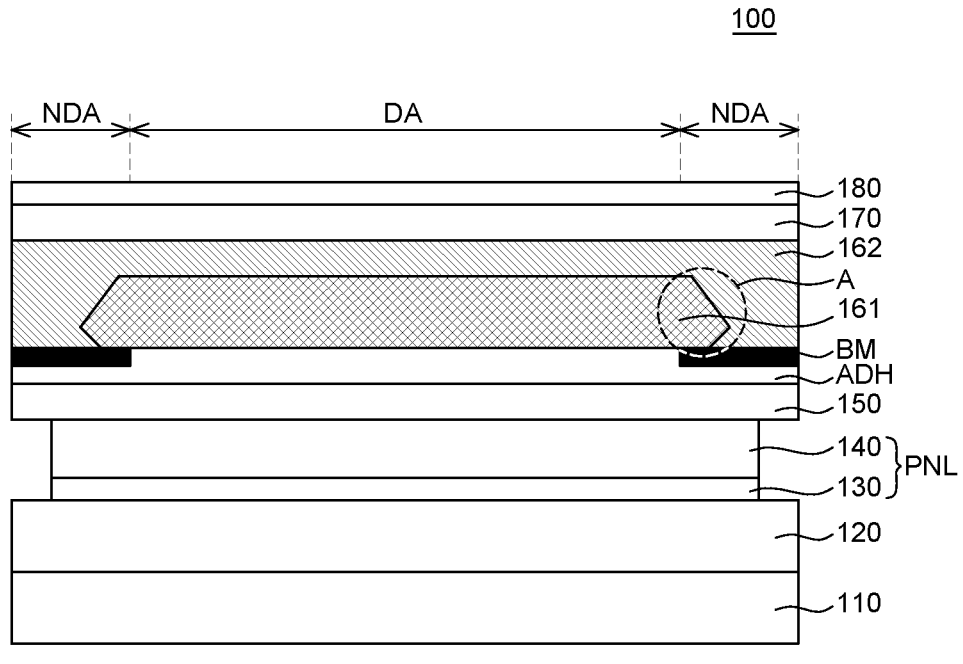
FIG. 1 is a cross-sectional view of a flexible display apparatus according to an exemplary embodiment of the present specification.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "comprising" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly" is not used.

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a display device according to exemplary embodiments of the present disclosure will be described in detail with reference to accompanying drawings.

In describing a configuration of the present specification, a thin plate glass means a glass with a thickness of 0.35 mm or less, unless otherwise stated, or else, it might be called as a plate glass. In addition, in describing the configuration of the present specification, a radius of curvature 1R means a radius of curvature of 1 mm, unless otherwise stated.

Figure 2:
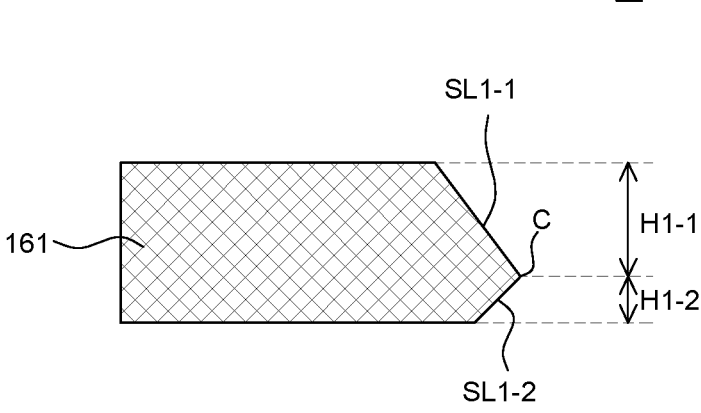
FIG. 2 is an enlarged view of area A in FIG. 1, according to an embodiment of the present disclosure.

FIG. 1 is a cross-sectional view of a flexible display apparatus according to an exemplary embodiment of the present specification. FIG. 2 is an enlarged view of area A in FIG. 1, according to an embodiment of the present disclosure.

With reference to FIG. 1, a flexible display apparatus 100 according to an exemplary embodiment of the present specification includes a plate assembly 110, a backplate 120, an organic light-emitting display panel PNL, an optical control layer 150, a thin plate glass 161, an adhesive layer 162, a shatterproof layer 170, and a hard coating layer 180. The thin plate glass 161, the adhesive layer 162, and the shatterproof layer 170 may constitute a cover member.

The flexible display apparatus according to an exemplary embodiment of the present specification will be described in terms of each constituent element.

The organic light-emitting display panel PNL may include a flexible substrate 130 and an organic light-emitting element 140.

The flexible substrate 130 is divided into a display area DA and a non-display area NDA. The display area DA is an area in which a plurality of pixels is disposed to display the image. The pixels including light-emitting areas for displaying the image may be disposed in the display area DA, and a driving circuit for operating the pixels may be disposed in the display area DA. The non-display area NDA is disposed to surround the display area DA. The non-display area NDA is an area where images are not displayed, and where various wiring, driving ICs, printed circuit boards, etc. are arranged to drive the pixels and driving circuits disposed in the display area DA.

The flexible substrate 130 supports various elements that constitute the organic light-emitting display panel PNL. The flexible substrate 130 may be a plastic substrate having flexibility. For example, the plastic substrate may be selected from polyimide, polyethersulfone, polyethylene terephthalate, and polycarbonate, but is not limited thereto. Since the plastic substrate has relatively weak barrier properties against moisture and oxygen, the plastic substrate may have a structure with a plastic film and an inorganic film stacked to compensate for this weakness. For example, the flexible substrate 130 may be a multilayer structure with a first polyimide film, an inorganic film, and a second polyimide film stacked sequentially.

The organic light-emitting element 140 is disposed on the flexible substrate 130. The organic light-emitting element 140 may include an anode, a cathode, and an organic light-emitting layer disposed therebetween. The organic light-emitting element 140 emits light when holes injected from the anode and electrons injected from the cathode are coupled in an organic light-emitting layer. This emitted light may be used to display images.

Between the flexible substrate 130 and the organic light-emitting element 140 is disposed driving thin-film transistors that drives the organic light-emitting element 140. The driving thin-film transistors may be disposed in each of a plurality of subpixel areas. For example, the driving thin-film transistor includes a gate electrode, an active layer, a source electrode, and a drain electrode. In addition, the driving thin-film transistor may further include a gate insulating layer that isolates the gate electrode from the active layer, and may further include an interlayer insulating layer that isolates the gate electrode from the source electrode and the drain electrode.

The organic light-emitting display panel PNL having flexibility may have difficulty in constantly maintaining the shape thereof when the flexible display apparatus 100 is folded or bent and may be susceptible to external stimulus.

Accordingly, various kinds of support members may be disposed on a rear surface of the organic light-emitting display panel PNL. For example, the backplate 120 and the plate assembly 110 may be disposed on a rear surface of the organic light-emitting display panel PNL.

When the flexible substrate 130, which is made of plastic, is used, the small thickness of the substrate may cause sagging of the organic light-emitting display panel PNL during folding or bending, for which the backplate 120 may be disposed on the rear surface of the organic light-emitting display panel PNL to compensate.

For example, the backplate 120 may be made of metals such as stainless steel (SUS), Invar, or plastic materials such as polymethylmethacrylate (PMMA), polycarbonate (PC), polyvinylalcohol (PVA), acrylonitrile-butadiene-styrene (ABS), polyethylene terephthalate (PET), silicone, and polyurethane (PU).

The flexible substrate 130 and the backplate 120 may be bonded using an optical clear adhesive (OCA) or a pressure sensitive adhesive (PSA), but are not limited thereto.

The plate assembly 110 may include a plate top and a plate bottom. The plate top and the plate bottom may be integrally formed, and the plate top or plate bottom may be omitted when necessary.

The plate bottom may include an opening pattern in a portion corresponding to folding or bending areas of the flexible display apparatus 100. Therefore, the rigidity of the organic light-emitting display panel PNL may be enhanced, and the stress during folding or bending may be effectively relieved. For example, the plate bottom may be made of metals such as stainless steel (SUS), Invar, or plastic materials such as polymethylmethacrylate (PMMA), polycarbonate (PC), polyvinyl alcohol (PVA), acrylonitrile-butadiene-styrene (ABS), polyethylene terephthalate (PET), silicone, and polyurethane (PU).

The plate top may be disposed between the backplate 120 and the plate bottom. The plate top may be made of a material with high rigidity to enhance the rigidity of the organic light-emitting display panel PNL. In addition, the plate top may inhibit the opening pattern of the plate bottom from being visible through the organic light-emitting display panel PNL. For example, the plate top may be formed of a metallic material such as stainless steel (SUS), Invar, aluminum series, or magnesium. As another example, the plate top may be made of a plastic material such as polymethylmethacrylate (PMMA), polycarbonate (PC), etc.

The plate assembly 110 may be bonded to the rear surface of the backplate 120 using an optical clear adhesive or a pressure sensitive adhesive.

An optical control layer 150 is disposed on an upper portion of the organic light-emitting display panel PNL. The optical control layer 150 may uniformly transmit light emitted from the organic light-emitting display panel PNL to the outside without reducing the luminance of the flexible display apparatus 100, and may absorb or reflect external light to improve display quality.

The optical control layer 150 may be bonded to the upper portion of the organic light emitting display panel PNL using an adhesive, such as an optical clear adhesive or a pressure sensitive adhesive.

A cover member is disposed on the optical control layer 150. The cover member protects the organic light-emitting display panel PNL from damage by external impact. In addition, the cover member may be bonded to the optical control layer 150 using an adhesive ADH, such as an optical clear adhesive or a pressure sensitive adhesive, and types of adhesive ADH are not limited thereto.

The cover member includes the thin plate glass 161, the adhesive layer 162, and the shatterproof layer 170.

An adhesive ADH is disposed on the optical control layer 150, and the thin plate glass 161 is disposed on an upper portion of the adhesive.

The thin plate glass 161 may have a thickness of 0.1 mm or less, but may be 50 μm to 90 μm, for example. In an exemplary embodiment of the present specification, the thin plate glass 161 is described as having a thickness of 70 μm to 90 μm. As described above, the limited thickness of thin plate glass may effectively relieve the stresses imposed when folding or bending the flexible display apparatus 100.

The thin plate glass 161 is disposed between the shatterproof layer 170 and the organic light-emitting display panel PNL and functions to directly protect the organic light-emitting display panel PNL.

A black matrix layer BM may be formed on the top surface or bottom surface of the thin plate glass 161 corresponding to the non-display area NDA. The black matrix layer BM includes a light-absorbing material, such as a light-absorbing metal, a carbon black, a black resin, etc. Therefore, components such as wiring that are disposed in non-display area NDA are not visible to the outside. In addition, the black matrix layer BM may suppress light leakage from a side surface portion of the flexible display apparatus 100.

Meanwhile, although not illustrated in FIG. 1, one or more thin plate glasses may be stacked on the thin plate glass 161, which are bonded by the adhesive layer. As such, the thin plate glass disposed on the thin plate glass 161 will be referred to as additional thin plate glass.

The additional thin plate glass is a component that is directly exposed to the outside and protects the organic light emitting display panel PNL from external impact. The additional thin plate glass may have a thickness of 0.1 mm or less, but may be, for example, 50 μm to 100 μm. As described above, the limited thickness of additional thin plate glass may effectively relieve the stresses imposed when folding or bending the flexible display apparatus 100.

In addition, the thickness of the additional thin plate glass may be the same as or different from the thickness of the thin plate glass 161. For example, the thin plate glass 161 may have a thickness of 70 μm to 90 μm, and the additional thin plate glass may have a thickness of 50 μm to 70 μm.

The additional thin plate glass stacked on the upper portion may be subjected to relatively greater stress than the thin plate glass 161 when folding or bending the flexible display apparatus 100. Accordingly, the thickness of the additional thin plate glass may be formed thinner than the thin plate glass 161 to reduce folding stress.

The thin plate glass 161 may be a chemically strengthened glass. The chemically strengthened glass is a glass that has been enhanced in strength by a chemical strengthening method. The chemical strengthening method is an ion exchange method by which sodium ions contained in the glass are replaced by ions with a larger ionic radius to increase the strength of the glass. As ions with a larger ionic radius than the sodium ions that constitute the glass are penetrated, a compressive stress layer may be formed at the surface of the glass, enhancing the strength of the glass.

For example, the chemically strengthened glass may be prepared by a process that replaces the sodium ions in the glass with potassium ions by immersing the glass in a solution of a potassium salt, such as potassium nitrate, and heating the glass for a predetermined period of time at a temperature range of 200° C. to 450° C. which is below a transition temperature of the glass.

When using the chemically strengthened glass as described above as the thin plate glass 161, the impact resistance may be further improved while maintaining high folding or bending properties.

In general, as the thickness of the glass becomes thinner, the impact resistance tends to decrease. In this regard, as illustrated in FIG. 1, the cover member according to an exemplary embodiment of the present specification is a structure in which the thin plate glass 161 has a cusp in a lateral portion, which may effectively reduce the folding stress while maintaining high impact resistance.

For example, as illustrated in FIG. 2, thin plate glass 161 has a cusp C in both lateral portions. Accordingly, the lateral portion of the thin plate glass 161 includes a first inclined surface SL1-1 that connects the cusp C to an edge of the top surface of the thin plate glass 161 and a second inclined surface SL1-2 that connects the cusp C to an edge of the bottom surface of the thin plate glass 161. The first inclined surface SL1-1 is inclined at a first angle with respect to a horizontal plane passing through the cusp C, and the second inclined surface SL1-2 is inclined at a second angle that is different from the first angle with respect to a horizontal plane passing through the cusp C. The thin plate glass 161 illustrated in FIG. 2 may have a thickness of 90 μm, for example.

In this case, an acute angle between the horizontal plane passing through the cusp C and the first inclined surface SL1-1 may be formed that is larger than an acute angle between the horizontal plane passing through the cusp C and the second inclined surface SL1-2. Further, a second vertical height H1-2 between the horizontal plane passing through the cusp C and the bottom surface of the thin plate glass 161 may be formed to be shorter than a first vertical height H1-1 between the horizontal plane passing through the cusp C and the top surface of the thin plate glass 161.

As described above, when the cusp is formed in the lateral portion of the thin plate glass 161, the folding stress that is more concentrated at the edge portion of the thin plate glass 161 when folding or bending may be significantly reduced, further improving the folding or bending characteristics of the flexible display apparatus 100. The structure and effect of the lateral portion of the thin plate glass 161 as described above according to an exemplary embodiment of the present specification will be described in more detail below with reference to FIGS. 3A to 5.

With reference back to FIG. 1, the shatterproof layer 170 is disposed on the upper portion of the thin plate glass 161. The shatterproof layer 170 may serve as a buffer to suppress breakage of the thin plate glass 161 from external impact, and to suppress scattering of fragments in the event of breakage.

For example, the shatterproof layer 170 may include a polyurethane or a silicone-based resin, which may be able to absorb externally applied impacts as well as suppress the spread of fragments when the glass breaks.

The shatterproof layer 170 according to the embodiment of the present specification may have a thickness in a range of 30 μm to 50 μm and be provided in the form of a film. In this case, the shatterproof layer 170 may have high surface hardness at a level of pencil hardness in a range of 4H to 6H.

The adhesive layer 162 is disposed between the shatterproof layer 170 and the thin plate glass 161, and the shatterproof layer 170 and the thin plate glass 161 are bonded.

As illustrated in FIG. 1, the adhesive layer 162 according to an exemplary embodiment of the present specification is disposed to cover all of the top surface and the lateral portion of the thin plate glass 161. In addition, the adhesive layer 162 has a high modulus of more than $1.0 \times 10^6$ Pa. Accordingly, the adhesive layer 162 may protect the lateral portion having the cusp of the thin plate glass 161 and simultaneously improve the strength of the front surface.

The adhesive layer 162 according to an exemplary embodiment of the present specification may have a thickness of 5 μm to 15 μm, in which case the dent characteristics of the cover member may be improved to a level of pencil hardness 6H under a condition of having a modulus of $1.0 \times 10^6$ Pa or more. As described above, as the hardness of the adhesive layer 162 improves, the folding or bending properties may be slightly reduced, but this may be sufficiently offset by the improvement in folding or bending properties due to the cusp formed structure in the lateral portion of the thin plate glass 161.

The adhesive layer 162 may be a variable adhesive, such as a photo-variable adhesive or a thermo-variable adhesive. That is, the thin plate glass 161 may be fixedly adhered to the optical control layer 150 using the adhesive ADH, such as an optical clear adhesive or a pressure sensitive adhesive, and adhered to the shatterproof layer 170 using the variable adhesive 162. As described above, when the thin plate glass 161 is bonded to the shatterproof layer 170 using the variable adhesive 162, the shatterproof layer 170 may be easily replaced by reducing adhesive strength, as necessary.

For example, when the adhesive layer 162 is a photo-variable adhesive, the adhesive strength changes depending on whether UV irradiation is present or absent, allowing the shatterproof layer 170 to be replaced by reducing the adhesive strength, as necessary. In addition, when the adhesive layer 162 is a thermo-variable adhesive, the adhesive layer 162 may have a reduced adhesive strength in a specific temperature range, or may including a thermally expandable material, thus have a reduced adhesive strength due to expansion of the thermally expandable material under certain temperature conditions, to facilitate replacement of the shatterproof layer 170.

In another example, the adhesive layer 162 may be a variable adhesive that is a moisture-peelable adhesive. The moisture-peelable adhesive is an adhesive that varies in adhesive strength depending on whether moisture is present, and the moisture-peelable adhesive includes an acrylic-based resin and a surfactant such as a fatty acid-based, straight-chain alkylbenzene-based, higher alcohol-based, alkylphenol-based, alpha-olefin-based, normal paraffin-based, alkyl glucoside-based, sucrose fatty acid ester-based, sorbitan fatty acid ester-based, polyoxyethylene sorbitan fatty acid esters-based. These surfactants contain hydrophilic groups and are capable of interacting with water. Therefore, when moisture is applied to a moisture-peelable adhesive, the surfactant with hydrophilic groups migrates to the surface of the adhesive and the adhesive strength is reduced. These properties can be utilized to separate the thin plate glass 161 from the shatterproof layer 170 by adding moisture to the moisture-peelable adhesive.

For example, the adhesive layer 162, including the variable adhesive, may have an adhesive strength of 1 kgf/inch or more when the thin plate glass 161 and the shatterproof layer 170 are bonded, and may have an adhesive strength of 100 gf/inch or less during a reworking process to replace the shatterproof layer 170. In this case, even if the flexible display apparatus 100 is folded/bent, slipping or peeling of each layer may be suppressed, and the adhesive strength may be reduced during the reworking process so that the shatterproof layer 170 may be easily replaced without damaging the organic light-emitting display panel PNL.

In addition, the adhesive layer 162 may be additionally disposed on the lower portion of the thin plate glass 161. In this case, the adhesive ADH may be disposed on the optical control layer 150, the adhesive layer 162 may be additionally disposed on the upper portion of the adhesive ADH, and the thin plate glass 161 may be disposed on the upper portion of the adhesive layer 162.

The shatterproof layer 170 according to an exemplary embodiment of the present specification forms the shatterproof layer by bonding the shatterproof film to the top surface of the thin plate glass 161 using an adhesive layer 162, rather than by coating a shatterproof coating agent. In this case, the shatterproof layer 170 may be relatively thicker than the shatterproof layer formed using the shatterproof coating agent. Therefore, this case may be effective in absorbing external impact and may inhibit the sharp surface of the thin plate glass from being exposed when the cover member is broken.

With reference to FIG. 1, the hard coating layer 180 is disposed on the shatterproof layer 170. A thickness of the hard coating layer 180 may be from 10 μm to 40 μm. The hard coating layer 180 may be formed with a layer of material having high strength to inhibit a front surface of the cover member from cracking or scratching due to external impact or friction.

In addition to the hard coating layer 180, various functional layers may be disposed between the thin plate glass 161 and the shatterproof layer 170 or on the upper portion of the shatterproof layer 170, as necessary. For example, the functional layer may be selected from an anti-fingerprint layer, an anti-reflective layer, an anti-contamination layer, an anti-glare layer, a viewing angle adjustment layer, an anti-static layer, and the like, and may be variously combined depending on the required material properties.

The flexible display apparatus according to an exemplary embodiment of the present specification uses the cover member including the thin plate glass with the cusp formed in the lateral portion thereof, so that impact resistance and folding or bending properties are simultaneously improved while maintaining high inherent surface properties of the glass.

For example, the flexible display apparatus 100 according to an exemplary embodiment of the present specification may be implemented with a radius of curvature of 5R or less, and may have excellent folding or bending properties and still have impact resistance beyond that of a cover member having a glass with no cusp formed.

Figure 3A:
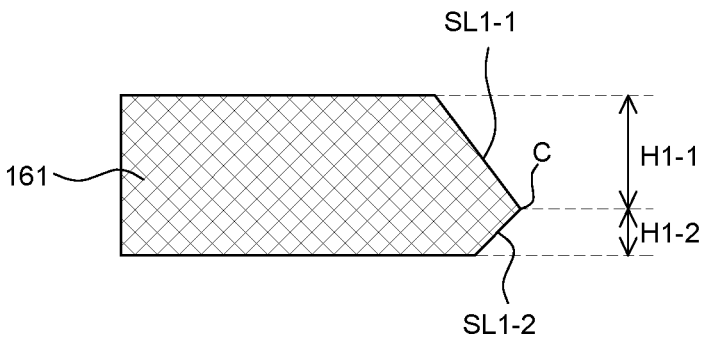
FIG. 3A is a view illustrating one example of a lateral portion shape of a thin plate glass, according to an exemplary embodiment of the present disclosure.
Figure 3B:
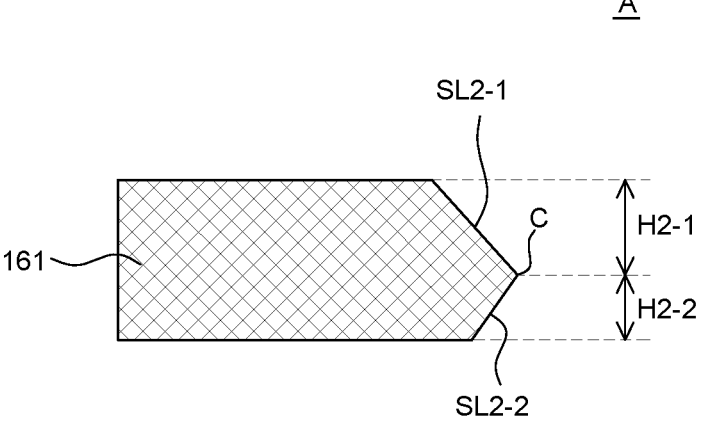
FIG. 3B is a view illustrating another example of the lateral portion shape of the thin plate glass, according to an exemplary embodiment of the present specification.

FIG. 3A is a view illustrating one example of a lateral portion shape of a thin plate glass, according to an exemplary embodiment of the present disclosure. FIG. 3B is a view illustrating another example of the lateral portion shape of the thin plate glass, according to an exemplary embodiment of the present specification.

Figure 4A:
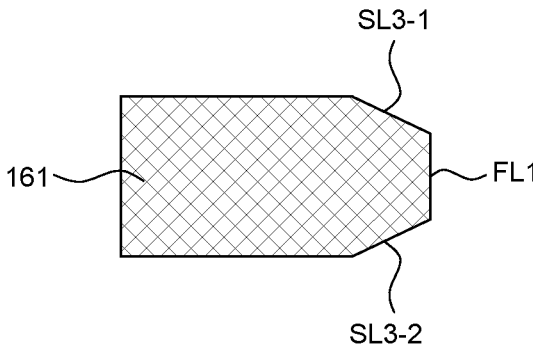
FIG. 4A is a view illustrating one example of the lateral portion shape of the thin plate glass for comparison to the thin plate glass shape with a cusp formed in the lateral portion according to an exemplary embodiment of the present specification illustrated in FIGS. 3A and 3B.
Figure 4B:
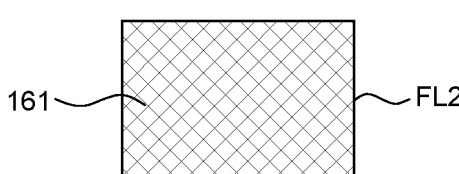
FIG. 4B is a view illustrating another example of the lateral portion shape of the thin plate glass for comparison to the thin plate glass shape with a cusp formed in the lateral portion according to an exemplary embodiment of the present specification illustrated in FIGS. 3A and 3B.
Figure 4C:
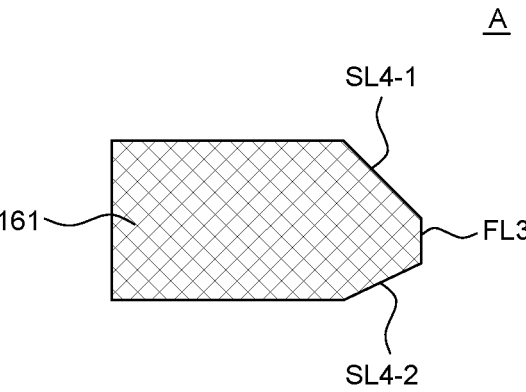
FIG. 4C is a view illustrating still another example of the lateral portion shape of the thin plate glass for comparison to the thin plate glass shape with a cusp formed in the lateral portion according to an exemplary embodiment of the present specification illustrated in FIGS. 3A and 3B.

FIG. 4A is a view illustrating one example of the lateral portion shape of the thin plate glass for comparison to the thin plate glass shape with a cusp formed in the lateral portion according to an exemplary embodiment of the present specification illustrated in FIGS. 3A and 3B. FIG. 4B is a view illustrating another example of the lateral portion shape of the thin plate glass for comparison to the thin plate glass shape with a cusp formed in the lateral portion according to an exemplary embodiment of the present specification illustrated in FIGS. 3A and 3B. FIG. 4C is a view illustrating still another example of the lateral portion shape of the thin plate glass for comparison to the thin plate glass shape with a cusp formed in the lateral portion according to an exemplary embodiment of the present specification illustrated in FIGS. 3A and 3B.

Figure 5:
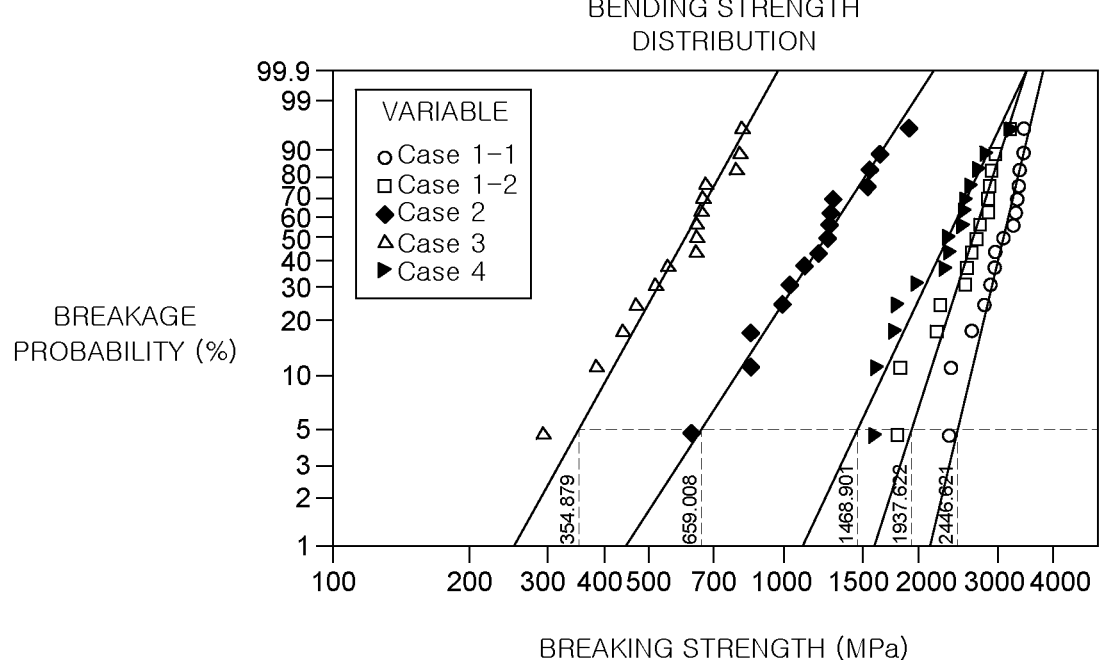
FIG. 5 is a distribution view comparing bending strength of the thin plate glass to which each example in FIGS. 3A to 4C is applied, according to an embodiment of the present disclosure.

FIG. 5 is a distribution view comparing bending strength of the thin plate glass to which each example in FIGS. 3A to 4C is applied, according to an embodiment of the present disclosure.

With reference to FIGS. 3A and 3B, the thin plate glass 161, according to an exemplary embodiment of the present specification, has a structure with cusp formation in the lateral portion, as previously described in FIG. 2. In contrast, FIGS. 4A to 4C illustrate comparative embodiments in which a flat side surface is formed on at least a portion of the lateral portion of the thin plate glass 161 rather than a cusp.

The cusp formed in the lateral portion of the thin plate glass 161 illustrated in FIG. 3A is closer to the bottom surface (i.e., a reference surface in the direction of folding or bending) than the cusp formed in the lateral portion of the thin plate glass 161 illustrated in FIG. 3B.

That is, a length of the first inclined surface SL1-1 of the thin plate glass 161 according to the exemplary embodiment illustrated in FIG. 3A (Case 1-1) is longer than a length of a first inclined surface SL2-1 of the thin plate glass 161 according to the exemplary embodiment illustrated in FIG. 3B (Case 1-2). The first vertical height H1-1 between the top surface of the thin plate glass 161 illustrated in FIG. 3A and the horizontal plane through the cusp is longer than a first vertical height H2-1 between the top surface of the thin plate glass 161 illustrated in FIG. 3B and the horizontal plane through the cusp. In addition, a length of the second inclined surface SL1-2 of the thin plate glass 161 illustrated in FIG. 3A is shorter than a length of the second inclined surface SL2-2 of the thin plate glass 161 illustrated in FIG. 3B. Further, the second vertical height H1-2 between the bottom surface of the thin plate glass 161 illustrated in FIG. 3A and the horizontal plane passing through the cusp is shorter than a second vertical height H2-2 between the bottom surface of the thin plate glass 161 illustrated in FIG. 3B and the horizontal plane passing through the cusp.

As described above, when the cusp is formed in the lateral portion of the thin plate glass 161, the folding or bending characteristics of the thin plate glass 161 are different depending on a position of the cusp.

The position of the cusp formed in the lateral portion of the thin plate glass 161 may be such that a ratio between the first vertical height and the second vertical height is set within a range of 6:4 to 8:2, and a ratio of 7:3 may optimally enhance the folding or bending characteristics. In this case, until the ratio between the first vertical height and the second vertical height reaches a specific condition (e.g., 7:3), the closer the cusp is positioned to the bottom surface of the thin plate glass 161, the better the folding or bending characteristics may be.

Meanwhile, with reference to FIGS. 4A and 4C, each of the comparative embodiments has a chamfer shape at an edge of the lateral portion, and a flat surface, or a side surface that is horizontal in a height direction of the thin plate glass 161, is formed at an end of the chamfer. In addition, with reference to FIG. 4B, the comparative embodiment may have a flat side surface shape without a protruding portion in the lateral portion. That is, the comparative embodiments illustrated in FIGS. 4A to 4C include the flat side surface in the lateral portion of the thin plate glass 161, which differs from the thin plate glass 161 having the cusp formed in the lateral portion according to an exemplary embodiment of the present specification.

The thin plate glass 161 according to the comparative embodiment (Case 2) illustrated in FIG. 4A has a flat surface FL1 in the lateral portion, a first inclined surface SL3-1 that connects the edge of the top surface to the flat surface FL1, and a second inclined surface SL3-2 that connects the edge of the bottom surface to the flat surface FL1.

The thin plate glass 161 according to the comparative embodiment (Case 3) illustrated in FIG. 4B is a structure in which a flat surface FL2 with a width equal to the thickness of the thin plate glass 161 is formed without a protruding portion in the lateral portion.

The thin plate glass 161 according to the comparative embodiment (Case 4) illustrated in FIG. 4C has a flat surface FL3 on the lateral portion, a first inclined surface SL4-1 that connects the edge of the top surface to the flat surface FL3, and a second inclined surface SL4-2 that connects the edge of the bottom surface to the flat surface FL3.

The comparative embodiment illustrated in FIG. 4A differs in that the first inclined surface SL3-1 and the second inclined surface SL3-2 are symmetrical with respect to the flat surface FL1, and the comparative embodiment illustrated in FIG. 4C differs in that the first inclined surface SL4-1 and the second inclined surface SL4-2 are asymmetrical with respect to the flat surface FL3.

With reference to FIG. 5, the bending (or folding) strength characteristic distribution is expressed in a Weibull distribution diagram on the basis of breaking strength and breakage probability results of the embodiments illustrated in FIGS. 3A and 3B and comparative embodiments illustrated in FIGS. 4A to 4C derived by experiments.

As illustrated in FIG. 5, it may be seen that the breaking strength and failure probability of the thin plate glass according to the exemplary embodiments of the present specification illustrated in FIGS. 3A and 3B are significantly superior to the breaking strength and failure probability of the thin plate glass according to the comparative exemplary embodiments illustrated in FIGS. 4A to 4C. In particular, among the comparative embodiments, the comparative embodiment in FIG. 4C has relatively better bending strength characteristics than the comparative embodiments in FIGS. 4A and 4B, but the exemplary embodiments of FIGS. 3A and 3B have better breaking strength and failure probability than the comparative embodiment in FIG. 4C. In addition, among the exemplary embodiments of the present specification, the exemplary embodiment in FIG. 3A has better breaking strength and failure probability compared to the exemplary embodiment in FIG. 3B, which means that the bending (or folding) strength characteristics are enhanced more significantly when the position of the cusp is positioned closer to the bottom surface of the thin plate glass 161 until the ratio between the first vertical height and the second vertical height reaches a specific condition (i.e., 7:3).

Hereinafter, the effect of the present specification described above will be described in more detail through an exemplary embodiment employing the thin plate glass with the cusp formed in the lateral portion according to an exemplary embodiment of the present specification and a comparative embodiment employing the thin plate glass without the cusp formed in the lateral portion. However, the following embodiments are for exemplifying the present specification, and the scope of the present specification is not limited by the following embodiments.

Embodiment A

The thin plate glass (70 μm) having the cusp formed in the lateral portion, the adhesive layer (15 μm) covering the lateral portion and the top surface of the thin plate glass and having a modulus of about $3.0 \times 10^6$ Pa, the shatterproof layer (30 μm) having a pencil hardness of 4H, and the hard coating layer (10 μm) were sequentially stacked to manufacture the flexible display apparatus as illustrated in FIG. 1.

Embodiment B

The thin plate glass (90 μm) having the cusp formed in the lateral portion, the adhesive layer (15 μm) covering the lateral portion and the top surface of the thin plate glass and having a modulus of about $8.0 \times 10^6$ Pa, the shatterproof layer (30 μm) having a pencil hardness of 4H, and the hard coating layer (40 μm) were sequentially stacked to manufacture the flexible display apparatus as illustrated in FIG. 1.

Comparative Embodiment C

The thin plate glass (50 μm) with no cusp formed in the lateral portion, the adhesive layer (50 μm) disposed on the upper portion of the thin plate glass and not covering the lateral portion, the shatterproof layer (50 μm) having a pencil hardness of 4H, and the hard coating layer (10 μm) were sequentially stacked to manufacture the flexible display apparatus.

Comparative Embodiment D

The thin plate glass (90 μm) with no cusp formed in the lateral portion, the adhesive layer (50 μm) disposed on the upper portion of the thin plate glass and not covering the lateral portion, the shatterproof layer (50 μm) having a pencil hardness of 4H, and the hard coating layer (10 μm) were sequentially stacked to produce the flexible display apparatus.

Experimental Embodiment: Folding or Bending Properties

Radii of curvature that may be implemented with display devices according to the embodiments and comparative embodiments are listed in Table 1.

TABLE 1

|  | Embodiment | | Comparative embodiment | |
| --- | --- | --- | --- | --- |
|  | A | B | C | D |
| Puncture failure characteristic | 9 Kgf | 10 Kgf | 3 Kgf | 5 Kgf |
| Surface     Pencil hardness | 6H | 6H | 2H | H |
| strength    Dent failure characteristic | 6H | 6H | B | B |
| Folding or bending property (radius of curvature) | 3R | 3.5R to 4R | 3R | 7R |

With reference to Table 1 above, in case of the Embodiments A and B using the cover member including the thin plate glass with the cusp formed in the lateral portion, it was confirmed that it may be implemented up to the level of 3R to 4R radius of curvature with excellent impact resistance properties and excellent folding or bending properties.

In contrast, in case of the Comparative embodiment C, it was confirmed that the folding or bending properties were measured to be 3R due to the relatively small thickness of the thin plate glass, but the impact resistance and surface strength were poor. In case of the Comparative embodiment D, a thickness condition of the thin plate glass is the same as that of the embodiment B, but it was confirmed that the folding or bending properties are very poor as well as the impact resistance and surface strength are poor as in the Comparative embodiment C.

As described above, it can be ascertained that when the thin plate glass is used to apply the cover member according to the embodiment of the present specification, the surface characteristics may be maintained at a high level, and the folding or bending properties and impact resistance may be improved at the same time, which is more advantageous for implementing the foldable display device.

As a result, it may be confirmed that the flexible display apparatus using the thin plate glass with the cusp formed in the lateral portion and the adhesive layer covering the top surface and lateral portion of the thin plate glass as the cover member may further maximize the surface properties and impact resistance while maintaining high folding or bending properties with the synergistic effect thereof.

Figure 6:
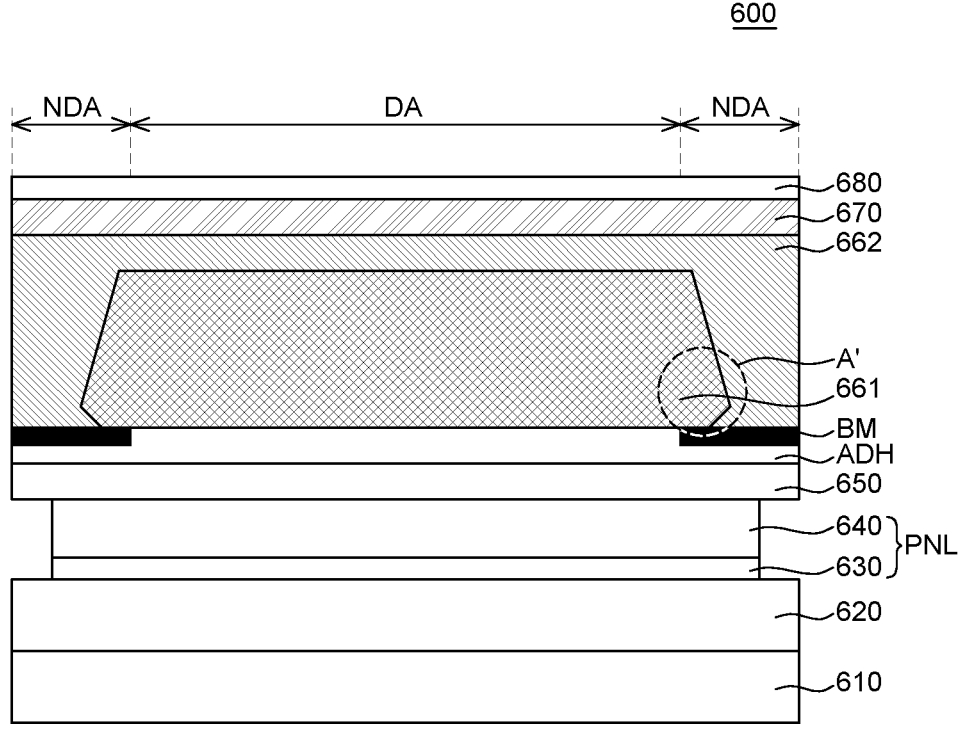
FIG. 6 is a cross-sectional view of a flexible display apparatus according to another embodiment of the present specification.

FIG. 6 is a cross-sectional view of a flexible display apparatus according to another embodiment of the present specification.

Figure 7A:
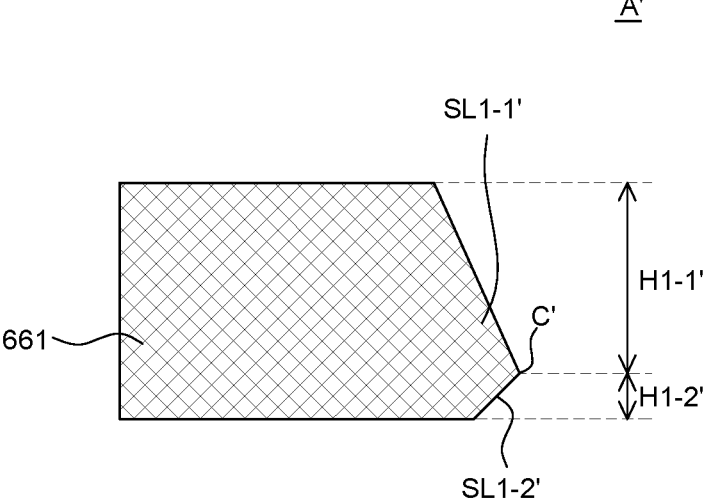
FIG. 7A is a view illustrating an embodiment of a lateral shape of a thin plate glass according to another embodiment of the present specification.
Figure 7B:
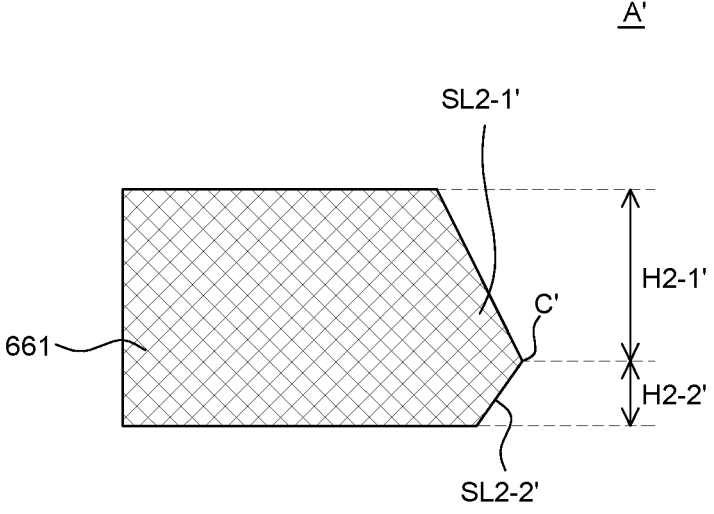
FIG. 7B is a view illustrating another embodiment of the lateral shape of the thin plate glass according to another embodiment of the present specification.

FIG. 7A is a view illustrating an embodiment of a lateral shape of a thin plate glass according to another embodiment of the present specification. FIG. 7B is a view illustrating another embodiment of the lateral shape of the thin plate glass according to another embodiment of the present disclosure. In addition, FIGS. 7A and 7B are enlarged views of area A' in FIG. 6.

With reference to FIG. 6, a flexible display apparatus 600 according to another embodiment of the present specification includes a plate assembly 610, a backplate 620, an organic light-emitting display panel PNL, an optical control layer 650, a thin plate glass 661, an adhesive layer 662, a flame-retardant film layer 670, and a hard coating layer 680. The thin plate glass 661, the adhesive layer 662, and the flame-retardant film layer 670 may constitute a cover member. The organic light-emitting display panel PNL may include a flexible substrate 630 and an organic light-emitting element 640.

Because the plate assembly 610, the backplate 620, the organic light-emitting display panel PNL, and the optical control layer 650 of the flexible display apparatus 600 according to another embodiment of the present specification illustrated in FIG. 6 are respectively and substantially identical to the plate assembly 110, the backplate 120, the organic light-emitting display panel PNL, and the optical control layer 150 of the flexible display apparatus 100 according to the embodiment of the present specification described with reference to FIG. 1, detailed descriptions thereof will be omitted.

The cover member is disposed on the optical control layer 650 and protects the organic light-emitting display panel PNL so that the organic light-emitting display panel PNL is not damaged by external impact.

The cover member may be bonded onto the optical control layer 650 by means of the adhesive ADH such as a light transparent adhesive or a pressure sensitive adhesive. However, the type of adhesive ADH is not limited thereto.

As illustrated in FIG. 6, the adhesive ADH may be disposed on the optical control layer 650, and the thin plate glass 661 may be disposed on an upper portion of the adhesive ADH.

The thin plate glass 661 has a thickness of 0.1 mm or more, e.g., 100 μm to 350 μm, so as to have flame retardancy. In another embodiment of the present specification, the thin plate glass 661 is described as having a thickness of 200 μm to 330 μm. As described above, the thin plate glass having the particular thickness may ensure the flexibility of the flexible display apparatus 600 and significantly improve flame retardancy, thereby ensuring safety by retarding flame in an extreme use environment such as a fire.

The thin plate glass 661 is disposed between the flame-retardant film layer 670 and the organic light-emitting display panel PNL and serves to directly protect the organic light-emitting display panel PNL.

A black matrix layer BM may be formed on the top or bottom surface of the thin plate glass 661 corresponding to the non-display area NDA. The black matrix layer BM includes a light-absorbing material, e.g., light-absorbing metal, carbon black, black resin, and the like. Therefore, constituent elements, such as lines disposed in the non-display area NDA, are not visible to the outside. In addition, the black matrix layer BM may suppress light leakage from a lateral portion of the flexible display apparatus 600.

The thin plate glass 661 may be a chemically strengthened glass. In this case, a chemically strengthened layer (i.e., compressive stress layer) on the surface of the chemically strengthened glass may have a thickness in a range of 5 μm to 15 μm or surface compressive stress of 400 MPa or more.

In addition, the thin plate glass 661 may have a structure having cusps formed at two opposite lateral portions thereof and effectively reduce folding stress while maintaining high impact resistance.

For example, as illustrated in FIGS. 7A and 7B, the thin plate glass 661 has a cusp C' formed on a lateral portion thereof. Therefore, the lateral portion of the thin plate glass 661 includes a first inclined surface SL1-1' configured to connect an edge of the top surface of the thin plate glass 661 and the cusp C', and a second inclined surface SL1-2' configured to connect an edge of the bottom surface of the thin plate glass 661 and the cusp C'. The first inclined surface SL1-1' is inclined at a first angle with respect to a horizontal plane passing through the cusp C', and the second inclined surface SL1-2' is inclined at a second angle different from the first angle with respect to the horizontal plane passing through the cusp C'. The thin plate glass 661 illustrated in FIGS. 7A and 7B may have a thickness of 330 μm.

In this case, an acute angle between the horizontal plane passing through the cusp C' and the first inclined surface SL1-1' may be larger than an acute angle between the horizontal plane passing through the cusp C' and the second inclined surface SL1-2'.

In addition, a second vertical height H1-2' between the horizontal plane passing through the cusp C' and the bottom surface of the thin plate glass 661 may be smaller than a first vertical height H1-1' between the horizontal plane passing through the cusp C' and the top surface of the thin plate glass 661.

As described above, when the cusp is formed on the lateral portion of the thin plate glass 661, the folding stress, which is further concentrated on the edge portion of the thin plate glass 661 when folding or bending, may be significantly reduced, thereby improving folding or bending properties of the cover member.

The cusp formed on the lateral portion of the thin plate glass 661 illustrated in FIG. 7A is closer to the bottom surface (i.e., a reference surface in the folding or bending direction) than the cusp formed on the lateral portion of the thin plate glass 661 illustrated in FIG. 7B.

That is, a length of the first inclined surface SL1-1' of the thin plate glass 661 according to the embodiment illustrated in FIG. 7A is longer than a length of a first inclined surface SL2-1' of the thin plate glass 661 according to the embodiment illustrated in FIG. 7B. The first vertical height H1-1' between the horizontal plane passing through the cusp C' and the top surface of the thin plate glass 661 illustrated in FIG. 7A is larger than a first vertical height H2-1' between the horizontal plane passing through the cusp C' and the top surface of the thin plate glass 661 illustrated in FIG. 7B.

In addition, a length of the second inclined surface SL1-2' of the thin plate glass 661 illustrated in FIG. 7A is smaller than a length of a second inclined surface SL2-2' of the thin plate glass 661 illustrated in FIG. 7B. Further, the second vertical height H1-2' between the horizontal plane passing through the cusp C' and the bottom surface of the thin plate glass 661 illustrated in FIG. 7A is smaller than a second vertical height H2-2' between the horizontal plane passing through the cusp C' and the bottom surface of the thin plate glass 661 illustrated in FIG. 7B.

As described above, when the cusp is formed on the lateral portion of the thin plate glass 661, the folding or bending properties of the thin plate glass 661 are different depending on the position of the cusp.

The position of the cusp formed on the lateral portion of the thin plate glass 661 may be defined such that a ratio between the first vertical height and the second vertical height is set within a range of 6:4 to 8:2, and a ratio of 7:3 may optimally enhance the folding or bending properties. In this case, until the ratio between the first vertical height and the second vertical height reaches a specific condition (e.g., 7:3), the closer the cusp is positioned to the bottom surface of the thin plate glass 661, the better the folding or bending properties may be.

With reference back to FIG. 6, the flame-retardant film layer 670 is disposed on the upper portion of the thin plate glass 661.

The flame-retardant film layer 670 may be made of a material having flame retardancy, thereby significantly increasing the flame retardancy of the cover member together with the thin plate glass 661. In addition, the flame-retardant film layer 670 may serve as a buffer to suppress damage to the thin plate glass 661 caused by external impact and suppress scattering of fragments in the event of damage to the thin plate glass 661.

The flame-retardant film layer 670 may have a thickness of 25 μm to 200 μm.

The flame-retardant film layer 670 may have a limiting oxygen index (LOI) of 27 or more and be made of a transparent polymer material.

The LOI means 'lowest volume concentration (vol %) of oxygen in an oxygen/nitrogen air mixture' required for a polymer sample to be ignited and burned without being extinguished for three minutes. The LOI may be defined as shown in Equation 1 below.

$$LOI = \left( \frac{V_{O_2}}{V_{O_2} + V_{N_2}} \right) \times 100 \qquad \text{[Equation 1]}$$

In Equation 1, $V_{O_2}$ represents an oxygen volume in air, and $V_{N_2}$ represents a nitrogen volume in air.

In the case of the polymer material, on the basis that oxygen accounts for 20.9 vol % in air, an LOI of 20.9 or less means that the polymer material is burned fast in air, and an LOI of 20.9 to 27 means that the polymer material is burned slowly in air. An LOI of 27 or more means a self-extinguishing polymer material that is difficult to burn in air.

For example, the flame-retardant film layer 670 may be made of a polyimide-based material having an LOI of 47 to 53 or a polycarbonate-based material having an LOI of 27.

The adhesive layer 662 is disposed between the flame-retardant film layer 670 and the thin plate glass 661, and the flame-retardant film layer 670 and the thin plate glass 661 are joined by the adhesive layer 662.

As illustrated in FIG. 6, the adhesive layer 662 according to another embodiment of the present specification is disposed to cover both the top surface and the lateral portion of the thin plate glass 661. The adhesive layer 662 may be made of a material having flame retardancy, thereby significantly increasing the flame retardancy of the cover member together with the thin plate glass 661 and the flame-retardant film layer 670. The adhesive layer 662 may protect the lateral portion having the cusp of the thin plate glass 661 and simultaneously improve the flame retardancy.

The adhesive layer 662 according to another embodiment of the present specification may be made of a transparent material having an LOI of 27 or more. The adhesive layer 662 may be made of a silicone-based material having flame retardancy, e.g., made of a polysiloxane-based material having an LOI of 30. The adhesive layer 662 may have a thickness in a range of 25 μm to 100 μm. The adhesive layer 662 may have a modulus of $1.0 \times 10^4$ Pa to $9.9 \times 10^6$ Pa.

In addition, the adhesive layer 662 may be additionally disposed on the lower portion of the thin plate glass 661. In this case, the adhesive ADH may be disposed on the optical control layer 650, the adhesive layer 662 may be additionally disposed on the upper portion of the adhesive ADH, and the thin plate glass 661 may be disposed on the upper portion of the adhesive layer 662. In this case, the adhesive layer 662 disposed between the optical control layer 650 and the thin plate glass 661 may have a thickness of 25 μm to 300 μm.

As illustrated in FIG. 6, the hard coating layer 680 is disposed on the flame-retardant film layer 670. The hard coating layer 680 may have a thickness of 5 μm to 10 μm.

The hard coating layer 680 may be formed with a layer of material having high strength to inhibit a front surface of the cover member from cracking or scratching due to external impact or friction. For example, the hard coating layer 680 may have surface hardness corresponding to pencil hardness of 3H or higher to suppress scratches and the like. The hard coating layer 680 may be made of a siloxane-based material.

In addition to the hard coating layer 680, various functional layers may be disposed between the thin plate glass 661 and the flame-retardant film layer 670 or the upper portion of the flame-retardant film layer 670, as necessary. For example, the functional layer may be selected from an anti-fingerprint layer, an anti-reflective layer, an anti-contamination layer, an anti-glare layer, a viewing angle adjustment layer, an anti-static layer, and the like, and may be variously combined depending on the required material properties.

As described above, the flexible display apparatus 600 according to another embodiment of the present specification uses the cover member including the thin plate glass with the cusp formed on the lateral portion thereof, so that impact resistance and folding or bending properties are simultaneously improved while maintaining high inherent surface properties of the glass. Further, the flexible display apparatus may include the thin plate glass having the thickness equal to or larger than the particular thickness so as to have flame retardancy, the flame-retardant film layer made of a material having flame retardancy, and the adhesive layer, thereby implementing both the flexibility and the flame retardancy.

Figure 8:
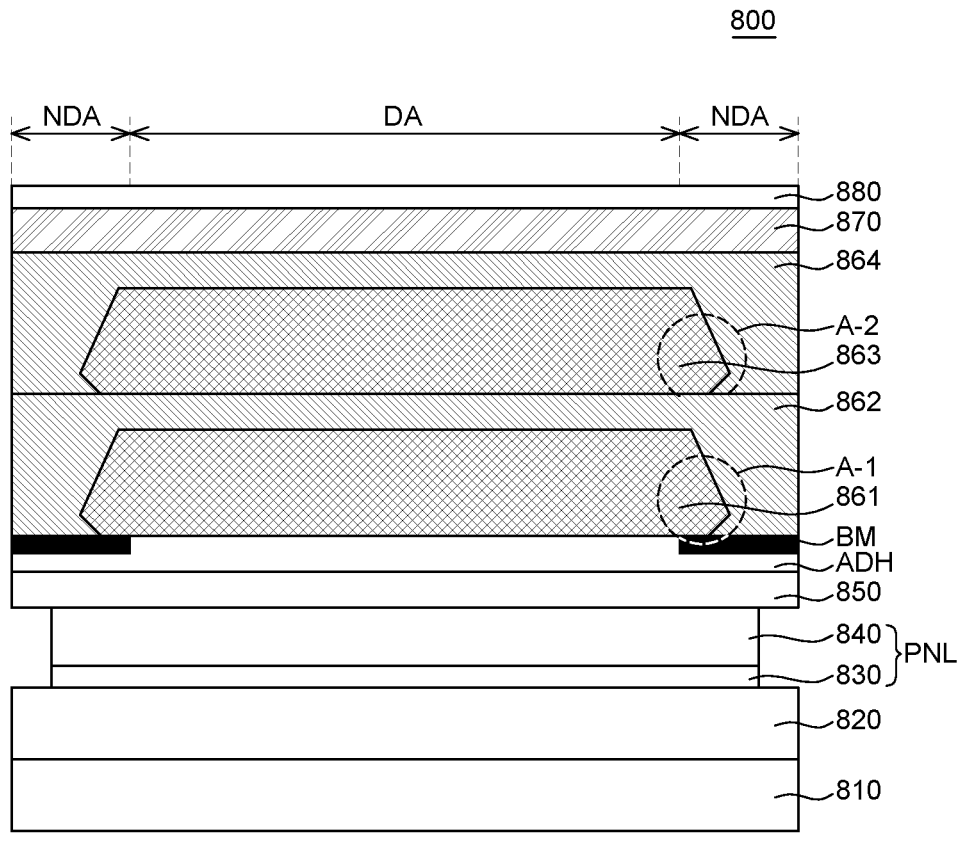
FIG. 8 is a cross-sectional view of a flexible display apparatus according to still another embodiment of the present specification.

FIG. 8 is a cross-sectional view of a flexible display apparatus according to still another embodiment of the present specification.

Figure 9A:
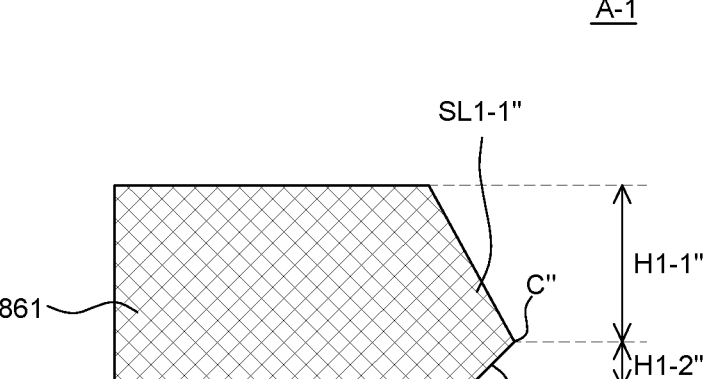
FIG. 9A is a view illustrating an embodiment of a lateral shape of a thin plate glass according to still another embodiment of the present specification.
Figure 9B:
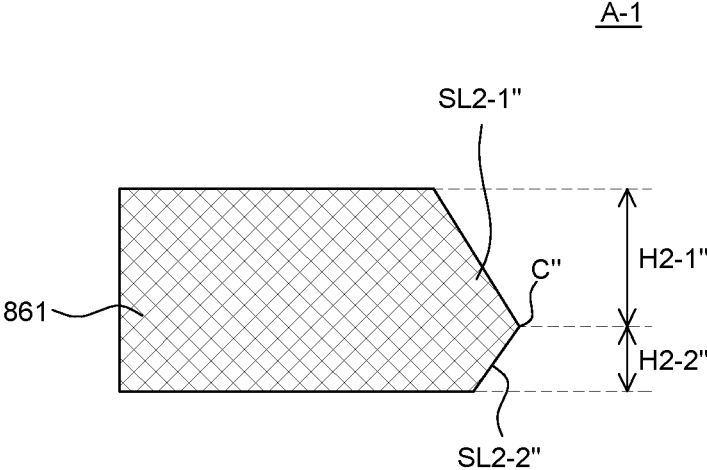
FIG. 9B is a view illustrating another embodiment of the lateral shape of the thin plate glass according to still another embodiment of the present specification.

FIG. 9A is a view illustrating an embodiment of a lateral shape of a thin plate glass according to still another embodiment of the present specification. FIG. 9B is a view illustrating another embodiment of the lateral shape of the thin plate glass according to still another embodiment of the present specification. In addition, FIGS. 9A and 9B are enlarged views of area 'A' in FIG. 8.

With reference to FIG. 8, a flexible display apparatus 800 according to still another embodiment of the present specification includes a plate assembly 810, a backplate 820, an organic light-emitting display panel PNL, an optical control layer 850, a first thin plate glass 861, a first adhesive layer 862, a second thin plate glass 863, a second adhesive layer 864, a flame-retardant film layer 870, and a hard coating layer 880.

The cover member includes at least one thin plate glass layer including the thin plate glass and the adhesive layer, and the flame-retardant film layer disposed on an upper portion of the thin plate glass layer disposed at the uppermost side. In the flexible display apparatus 800 according to still another embodiment of the present specification, the first thin plate glass layer, which includes the first thin plate glass 861 and the first adhesive layer 862, the second thin plate glass layer, which includes the second thin plate glass 863 and the second adhesive layer 864, and the flame-retardant film layer 870 may constitute the cover member.

The organic light-emitting display panel PNL may include a flexible substrate 830 and an organic light-emitting element 840.

Because the plate assembly 810, the backplate 820, the organic light-emitting display panel PNL, and the optical control layer 850 of the flexible display apparatus 800 according to still another embodiment of the present specification illustrated in FIG. 8 are respectively and substantially identical to the plate assembly 110, the backplate 120, the organic light-emitting display panel PNL, and the optical control layer 150 of the flexible display apparatus 100 according to the embodiment of the present specification described with reference to FIG. 1, detailed descriptions thereof will be omitted.

In addition, because the structures and features of the cover member and the hard coating layer 880 of the flexible display apparatus 800 according to still another embodiment of the present specification illustrated in FIG. 8 are substantially identical to those of the thin plate glass 661, the adhesive layer 662, the flame-retardant film layer 670, and the hard coating layer 680 of the flexible display apparatus 600 according to another embodiment of the present specification described with reference to FIGS. 6 to 7B, except for the configuration in which the thin plate glass layer is provided as two or more layers, repeated descriptions thereof will be omitted.

The cover member is disposed on the optical control layer 850, first thin plate glass layers 861 and 862 are disposed on an upper portion of the optical control layer 850, and second thin plate glass layers 863 and 864 are disposed on upper portions of the first thin plate glass layers 861 and 862.

The first thin plate glass 861 and the second thin plate glass 863 may each have a thickness of 0.1 mm or more, e.g., 100 μm to 350 μm so as to have flame retardancy. In still another embodiment of the present specification, the first and second thin plate glasses 861 and 863 are each described as having a thickness of 200 μm to 330 μm. As described above, the thin plate glass having the particular thickness may ensure the flexibility of the flexible display apparatus 800 and significantly improve flame retardancy, thereby ensuring safety by retarding flame in an extreme use environment such as a fire.

The first and second thin plate glasses 861 and 863 are disposed between the flame-retardant film layer 870 and the organic light-emitting display panel PNL and serve to directly protect the organic light-emitting display panel PNL.

The black matrix layer BM may be formed on a bottom surface of the first thin plate glass 861 corresponding to the non-display area NDA, and the black matrix layer BM may be formed on a top surface of the second thin plate glass 863 corresponding to the non-display area NDA.

The first and second thin plate glasses 861 and 863 may each be a chemically strengthened glass. In this case, a chemically strengthened layer (i.e., compressive stress layer) on the surface of the chemically strengthened glass may have a thickness in a range of 5 μm to 15 μm or surface compressive stress of 400 MPa or more.

In addition, the first and second thin plate glasses 861 and 863 may each have a structure having cusps formed at two opposite lateral portions thereof and effectively reduce folding stress while maintaining high impact resistance.

For example, as illustrated in FIGS. 9A and 9B, the first thin plate glass 861 has a cusp C" formed on a lateral portion thereof. The lateral portion of the first thin plate glass 861 includes a first inclined surface SL1-1" configured to connect an edge of a top surface of the thin plate glass 861 and the cusp C", and a second inclined surface SL1-2" configured to connect an edge of a bottom surface of the thin plate glass 861 and the cusp C". The first inclined surface SL1-1" is inclined at a first angle with respect to a horizontal plane passing through the cusp C", and the second inclined surface SL1-2" is inclined at a second angle different from the first angle with respect to the horizontal plane passing through the cusp C". The first thin plate glass 861 illustrated in FIGS. 9A and 9B may each have a thickness of 200 μm.

In this case, an acute angle between the horizontal plane passing through the cusp C" and the first inclined surface SL1-1" may be larger than an acute angle between the horizontal plane passing through the cusp C" and the second inclined surface SL1-2".

In addition, a second vertical height H1-2" between the horizontal plane passing through the cusp C" and the bottom surface of the first thin plate glass 861 may be smaller than a first vertical height H1-1" between the horizontal plane passing through the cusp C" and the top surface of the first thin plate glass 861.

As described above, when the cusp is formed on the lateral portion of the first thin plate glass 861, the folding stress, which is further concentrated on the edge portion of the first thin plate glass 861 when folding or bending, may be significantly reduced, thereby improving folding or bending properties of the cover member.

The cusp formed on the lateral portion of the first thin plate glass 861 illustrated in FIG. 9A is closer to the bottom surface (i.e., the reference surface in the folding or bending direction) than the cusp formed on the lateral portion of the second thin plate glass 863 illustrated in FIG. 9B.

That is, a length of the first inclined surface SL1-1" of the first thin plate glass 861 according to the embodiment illustrated in FIG. 9A is longer than a length of a first inclined surface SL2-1" of the first thin plate glass 861 according to the embodiment illustrated in FIG. 9B. The first vertical height H1-1" between the horizontal plane passing through the cusp C" and the top surface of the first thin plate glass 861 illustrated in FIG. 9A is larger than a first vertical height H2-1" between the horizontal plane passing through the cusp C" and the top surface of the first thin plate glass 861 illustrated in FIG. 9B. In addition, a length of the second inclined surface SL1-2" of the first thin plate glass 861 illustrated in FIG. 9A is smaller than a length of a second inclined surface SL2-2" of the first thin plate glass 861 illustrated in FIG. 9B. Further, the second vertical height H1-2" between the horizontal plane passing through the cusp C" and the bottom surface of the first thin plate glass 861 illustrated in FIG. 9A is smaller than a second vertical height H2-2" between the horizontal plane passing through the cusp C" and the bottom surface of the first thin plate glass 861 illustrated in FIG. 9B.

As described above, when the cusp is formed on the lateral portion of the first thin plate glass 861, the folding or bending properties of the first thin plate glass 861 are different depending on the position of the cusp.

The position of the cusp C" formed on the lateral portion of the first thin plate glass 861 may be defined such that a ratio between the first vertical height and the second vertical height is set within a range of 6:4 to 8:2, and a ratio of 7:3 may optimally enhance the folding or bending properties. In this case, until the ratio between the first vertical height and the second vertical height reaches a specific condition (e.g., 7:3), the closer the cusp is positioned to the bottom surface of the first thin plate glass 861, the better the folding or bending properties may be.

As described above, FIGS. 9A and 9B illustrate only the lateral portion of the first thin plate glass 861. However, the second thin plate glass 863 also has a substantially identical feature.

With reference back to FIG. 8, the flame-retardant film layer 870 is disposed on the upper portions of the second thin plate glass layers 863 and 864.

The flame-retardant film layer 870 may be made of a material having flame retardancy, thereby significantly increasing the flame retardancy together with the first and second thin plate glasses 861 and 863. In addition, the flame-retardant film layer 870 may serve as a buffer to suppress damage to the first and second thin plate glasses 861 and 863 caused by external impact and suppress scattering of fragments in the event of damage to the first and second thin plate glasses 861 and 863.

The flame-retardant film layer 870 may have an LOI of 27 or more and be made of a transparent polymer material. For example, the flame-retardant film layer 870 may be made of a polyimide-based material having an LOI of 47 to 53 or a polycarbonate-based material having an LOI of 27. The flame-retardant film layer 870 may have a thickness of 25 μm to 200 μm.

The second adhesive layer 864 is disposed between the flame-retardant film layer 870 and the second thin plate glass 863, and the first adhesive layer 862 is disposed between the first thin plate glass 861 and the second thin plate glass 863. The flame-retardant film layer 870 and the second thin plate glass 863 are joined by the second adhesive layer 864, and the second thin plate glass 863 and the first thin plate glass 861 are joined by the first adhesive layer 862. That is, the flame-retardant film layer 870 and the first and second thin plate glasses layers are joined by the first and second adhesive layers 862 and 864.

As illustrated in FIG. 8, the first and second adhesive layers 862 and 864 according to still another embodiment of the present specification are disposed to respectively cover the top surfaces and the lateral portions of the first and second thin plate glasses 861 and 863. In addition, the first and second adhesive layers 862 and 864 may each be made of a material having flame retardancy, thereby significantly increasing the flame retardancy of the cover member together with the first thin plate glass 861, the second thin plate glass 863, and the flame-retardant film layer 870. The first and second adhesive layers 862 and 864 may protect the lateral portions having the cusps of the first and second thin plate glasses 861 and 863 and simultaneously improve flame retardancy.

The first and second adhesive layers 862 and 864 according to still another embodiment of the present specification may each be made of a transparent material having an LOI of 27 or more. The first and second adhesive layers 862 and 864 may each be made of a silicone-based material having flame retardancy, e.g., made of a polysiloxane-based material having an LOI of 30. The first and second adhesive layers 862 and 864 may each have a thickness in a range of 25 μm to 15 μm. The first and second adhesive layers 862 and 864 may each have a modulus of $1.0 \times 10^4$ Pa to $9.9 \times 10^6$ Pa.

In addition, the adhesive layer having flame retardancy may be additionally disposed on the lower portion of the first thin plate glass 861. In this case, the adhesive ADH may be disposed on the optical control layer 850, an additional adhesive layer may be disposed on the upper portion of the adhesive ADH, and the first thin plate glass 861 may be disposed on an upper portion of the additional adhesive layer. In this case, the additional adhesive layer disposed between the optical control layer 850 and the first thin plate glass 861 may be made of the same material as the first and second adhesive layers 862 and 864 and have a thickness of 25 μm to 300 μm.

In still another embodiment of the present specification, the cover member having the two thin plate glass layers has been described. However, the number of thin plate glass layers included in the cover member is not limited thereto.

The cover member including the two or more thin plate glass layers described with reference to FIGS. 8 to 9B may further improve the flame retardancy in comparison with the cover member including only the single thin plate glass layer described with reference to FIG. 6. In addition, in case that a thickness of each of the thin plate glasses included in the cover member including the two or more thin plate glass layers is smaller than a thickness of the thin plate glass included in the cover member including only the single thin plate glass layer, the flexibility may be further improved in comparison with the cover member including only the single thin plate glass layer.

As illustrated in FIG. 8, the hard coating layer 880 is disposed on the flame-retardant film layer 870.

In addition to the hard coating layer 880, various functional layers may be disposed between the second thin plate glass 863 and the flame-retardant film layer 870 or the upper portion of the flame-retardant film layer 870, as necessary. For example, the functional layer may be selected from an anti-fingerprint layer, an anti-reflective layer, an anti-contamination layer, an anti-glare layer, a viewing angle adjustment layer, an anti-static layer, and the like, and may be variously combined depending on the required material properties.

As described above, the flexible display apparatus 800 according to still another embodiment of the present specification uses the cover member including the thin plate glass with the cusp formed on the lateral portion thereof, so that impact resistance and folding or bending properties are simultaneously improved while maintaining high inherent surface properties of the glass. Further, the cover member including the two or more thin plate glass layers is used, such that the thin plate glasses, which each have the thickness having flame retardancy, the flame-retardant film layer, which is made of a material having flame retardancy, and the adhesive layers may be included, thereby implementing both the improved flexibility and flame retardancy.

Hereinafter, the effects of simultaneously ensuring the folding or bending properties and the flame retardancy of the cover member according to the embodiments according to the present specification will be described with reference to the embodiment illustrated in FIG. 6 in which the thin plate glass having the cusp formed on the lateral portion according to another embodiment of the present specification is adopted, the embodiment illustrated in FIG. 8 in which the thin plate glasses having the cusps formed on the lateral portions according to still another embodiment of the present specification are adopted, and comparative embodiments in which the thin plate glass having no cusp formed on the lateral portion is adopted. The following embodiments are for exemplifying the present specification, and the scope of the present specification is not limited by the following embodiments.

Embodiment 1

The flexible display apparatus illustrated in FIG. 6 was manufactured by sequentially stacking the single thin plate glass (200 μm) having the cusp formed on the lateral portion thereof and having the thickness having flame retardancy, the adhesive layer (25 μm) configured to cover the lateral portion and the top surface of the thin plate glass and made of a material having flame retardancy, the additional adhesive layer (200 μm) configured to adjoin the bottom surface of the thin plate glass and made of a material having flame retardancy, and the flame-retardant film layer (50 μm) and the hard coating layer (10 μm) made of a material having flame retardancy.

Embodiment 2

The flexible display apparatus illustrated in FIG. 8 was manufactured by sequentially stacking the first thin plate glass (200 μm) having the cusp formed on the lateral portion thereof and having the thickness having flame retardancy, the adhesive layer (75 μm) configured to cover the lateral portion and the top surface of the first thin plate glass and made of a material having flame retardancy, the additional adhesive layer (200 μm) configured to adjoin the bottom surface of the first thin plate glass and made of a material having flame retardancy, the second thin plate glass (200 μm) having the cusp formed on the lateral portion thereof and having the thickness having flame retardancy, the adhesive layer (25 μm) configured to cover the lateral portion and the top surface of the second thin plate glass and made of a material having flame retardancy, and the flame-retardant film layer (50 μm) and the hard coating layer (10 μm) made of a material having flame retardancy.

Embodiment 3

The flexible display apparatus illustrated in FIG. 6 was manufactured by sequentially stacking the single thin plate glass (330 μm) having the cusp formed on the lateral portion thereof and having flame retardancy and a thickness larger than the thickness in Embodiment 1, the adhesive layer (25 μm) configured to cover the lateral portion and the top surface of the thin plate glass and made of a material having flame retardancy, the additional adhesive layer (200 μm) configured to adjoin the bottom surface of the thin plate glass and made of a material having flame retardancy, and the flame-retardant film layer (50 μm) and the hard coating layer (10 μm) made of a material having flame retardancy.

Comparative Embodiment 1

A flexible display apparatus was manufactured by sequentially stacking a thin plate glass (90 μm) having a cusp formed on a lateral portion thereof and having a thickness having no flame retardancy, an adhesive layer (5 μm) configured to cover a lateral portion and a top surface of the thin plate glass and made of a material having non-flame retardancy, an additional adhesive layer (50 μm) configured to adjoin a bottom surface of the thin plate glass and made of a material having non-flame retardancy, and a flame-retardant film layer (50 μm) and a hard coating layer (10 μm) made of a material having flame retardancy.

Comparative Embodiment 2

A flexible display apparatus was manufactured by sequentially stacking a thin plate glass (90 μm) having a cusp formed on a lateral portion thereof and having a thickness having no flame retardancy, an adhesive layer (25 μm) configured to cover a lateral portion and a top surface of the thin plate glass and made of a material having flame retardancy, an additional adhesive layer (200 μm) configured to adjoin a bottom surface of the thin plate glass and made of a material having flame retardancy, and a flame-retardant film layer (50 μm) and a hard coating layer (10 μm) made of a material having flame retardancy.

Comparative Embodiment 3

A flexible display apparatus was manufactured by sequentially stacking a single thin plate glass (200 μm) having no cusp formed on a lateral portion thereof but having a thickness having flame retardancy, an adhesive layer (25 μm) configured to cover a lateral portion and a top surface of the thin plate glass and made of a material having flame retardancy, an additional adhesive layer (200 μm) configured to adjoin a bottom surface of the thin plate glass and made of a material having flame retardancy, and a flame-retardant film layer (50 μm) and a hard coating layer (10 μm) made of a material having flame retardancy.

Experimental Embodiment: Folding or Bending Properties

Radii of curvature, which may be implemented with display devices according to the embodiments and comparative embodiments are listed in Table 2.

TABLE 2

|  | Folding or bending properties (Radii of curvature) |
| --- | --- |
| Embodiment 1 | 13.6R |
| Embodiment 2 | 16.6R |
| Embodiment 3 | 26.5R |
| Comparative Embodiment 1 | 3.3R |
| Comparative Embodiment 2 | 3.2R |
| Comparative Embodiment 3 | 52.8R |

With reference to Table 2 above, in the case of Embodiments 1 to 3 each using the cover member including the thin plate glass having the cusp formed on the lateral portion thereof and having the thickness having flame retardancy, it was confirmed that the folding or bending properties may be implemented up to levels of the radii of curvature of 13.6R, 16.6R, and 26.5R. In contrast, it was confirmed that Comparative Embodiment G is identical in thickness condition of the thin plate glass to Embodiments E and F, but folding or bending properties in Comparative Embodiment G represent the radius of curvature of 52.8R that was very poor.

Figure 10:
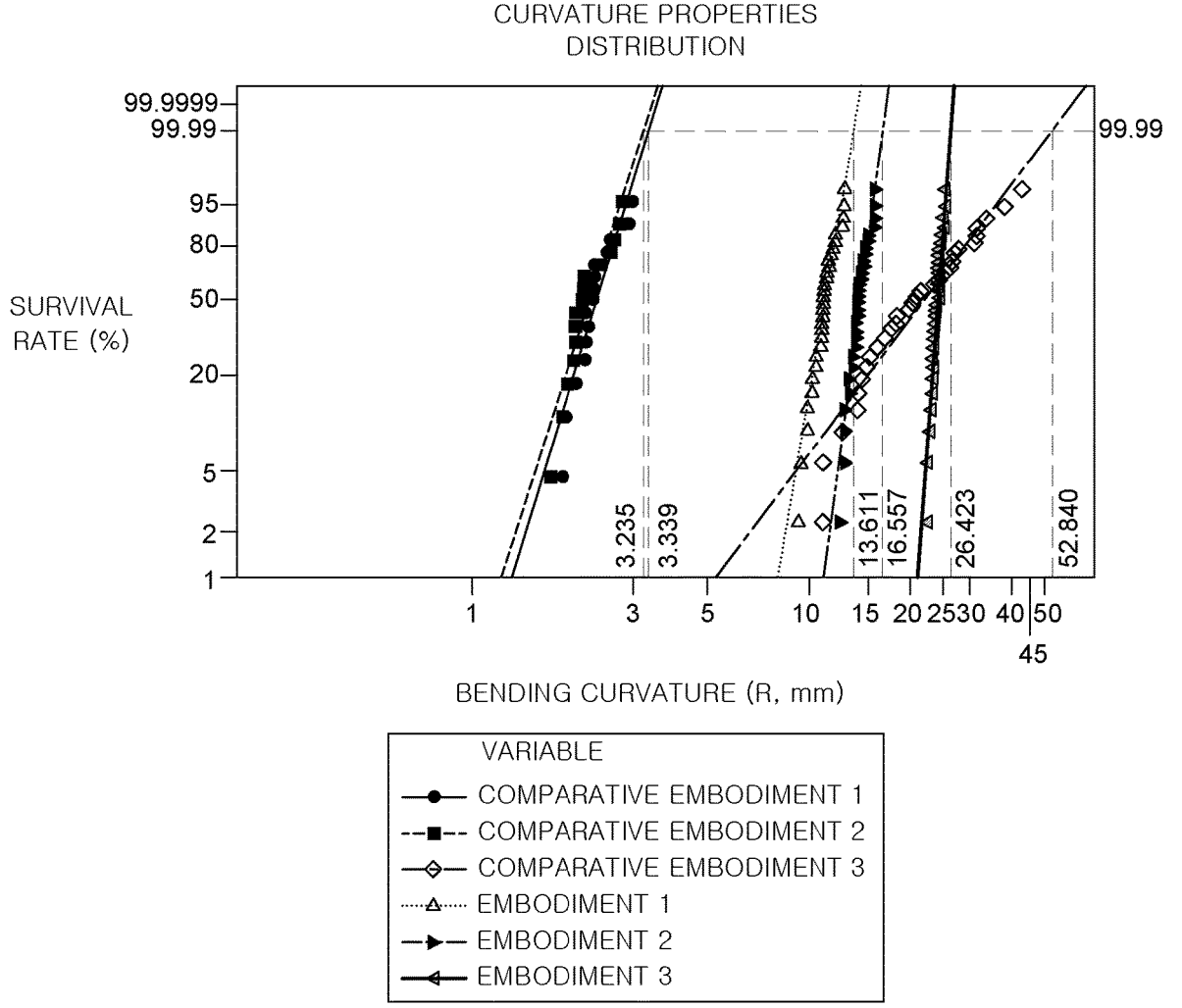
FIG. 10 is a distribution diagram illustrating a comparison in curvature characteristics between thin plate glasses according to several embodiments of the present specification and thin plate glasses according to the comparative embodiments.

FIG. 10 is a distribution diagram illustrating a comparison in curvature characteristics between thin plate glasses according to several embodiments of the present specification and thin plate glasses according to the comparative embodiments.

With reference to FIG. 10, the curvature characteristic distribution of Embodiments 1 to 3 and Comparative Embodiments 1 to 3 is expressed in a Weibull distribution diagram on the basis of experiments.

As illustrated in FIG. 10, under the same condition in which the cusp is formed on the lateral portion of the thin plate glass, the curvature characteristics of Comparative Embodiments 1 and 2 using the thin plate glass having the thickness having no flame retardancy are better than the curvature characteristics of Embodiments 1 to 3 using the thin plate glass with the thickness having flame retardancy.

However, under the same condition in which the thin plate glass has the thickness having flame retardancy, the curvature characteristics of Comparative Embodiment 3 using the thin plate glass having no cusp formed on the lateral portion thereof are significantly inferior in comparison with the curvature characteristics of Embodiments 1 to 3 using the thin plate glass having the cusp formed on the lateral portion thereof.

That is, it can be seen that the application of the cover member according to the embodiments of the present specification is advantageous in implementing the foldable display device because both flame retardancy and excellent folding or bending properties may be ensured.

Hereinafter, the excellent flame retardancy effect of the cover member according to the embodiments according to the present specification will be described with reference to Embodiments 1 and 3 above in which the thin plate glass with the thickness having flame retardancy and the adhesive layer having flame retardancy are adopted, Embodiment 2 above in which the two or more thin plate glasses with the thickness having flame retardancy and the adhesive layer having flame retardancy are adopted, Comparative Embodiment 1 above in which the thin plate glass with the thickness having no flame retardancy and the adhesive layer having non-flame retardancy are adopted, and Comparative Embodiment 2 above in which the thin plate glass with the thickness having no flame retardancy and the adhesive layer having flame retardancy are adopted.

Experimental Embodiment: Flame Retardancy Characteristics

Flame retardancy characteristics, which may be implemented with the display devices according to the embodiments and comparative embodiments are listed in Table 3.

TABLE 3

|  | Flame retardancy characteristics (HRR) | | |
| --- | --- | --- | --- |
|  | Peak value (kW/m²) (within five minutes) | Peak time (sec) | Total amount for two minutes (kW*min/m²) |
| Embodiment 1 | 51.3 | 91 | 31 |
| Embodiment 2 | 24.4 | 146 | 13 |
| Embodiment 3 | 44.6 | 105 | 29 |
| Comparative Embodiment 1 | 58 | 32.6 | 45 |
| Comparative Embodiment 2 | 64 | 77 | 56 |

Table 3 above shows the results of evaluating flame retardancy after performing combustion tests under the same condition for Embodiments 1 to 3 and Comparative Embodiments 1 and 2. In addition, in Table 3, HRR is a heat release rate that means the amount of released heat per unit time of a burning material.

In Table 3, the flame retardancy characteristics become better as a peak value of the HRR decreases within five minutes after the start of the combustion test. The flexible display apparatus, which may be applied to vehicles, railroads, and aircraft may be essentially designed to have a peak value of the HRR of 65 or less within five minutes and preferably designed to have a value of 55 or less.

In addition, in Table 3, the flame retardancy characteristics become better as a peak time for which the peak value of the HRR is maintained increases. The flexible display apparatus, which may be applied to vehicles, railroads, and aircraft, may be designed so that the peak time for which the peak value of the HRR is maintained is at least one minute and thirty seconds or longer.

In addition, in Table 3, the flame retardancy characteristics become better as a total amount of HRR decreases for two minutes after the start of the combustion test, which means that the amount of flame decreases during the combustion as the total amount of HRR decreases.

With reference to Table 3, it can be seen that in the case of Embodiments 1 and 3 each including the single thin plate glass with the thickness having flame retardancy, Embodiment 3 with the larger thickness of 330 μm of the thin plate glass has the excellent flame retardancy characteristics with respect to the conditions for evaluating the flame retardancy characteristics (i.e., the peak value of the HRR within five minutes after the start of the combustion test, the peak time for which the peak value of the HRR is maintained, and the total amount of HRR for two minutes) in comparison with Embodiment 1 with the thickness of 200 μm of the thin plate glass.

In addition, with reference to Table 3, in the case of Embodiments 1 and 2 each including one or more thin plate glasses with the same thickness, Embodiment 2 including the thin plate glass having the two layers with the thickness of 200 μm has the excellent flame retardancy characteristics with respect to the conditions for evaluating the flame retardancy characteristics in comparison with Embodiment 1 including the single thin plate glass with the thickness of 200 μm.

That is, in the case of Embodiments 1 to 3 including the thin plate glass with the thickness having flame retardancy, the flame retardancy characteristics become better as the thickness of the single thin plate glass increases. Under the condition in which the thickness of the thin plate glass remains the same, the flame retardancy characteristics become better as the number of thin plate glass layers increases.

Meanwhile, with reference to Table 3, it can be seen that Comparative Embodiments 1 and 2, which each include the thin plate glass with the thickness (i.e., less than 100 μm) having no flame retardancy, have inferior flame retardancy characteristics with respect to the conditions for evaluating the flame retardancy characteristics in comparison with Embodiments 1 to 3 each including the thin plate glass with the thickness having flame retardancy.

In addition, with reference to Table 3, it can be seen that Comparative Embodiment 1, in which at least one of the adhesive layers in the cover member is made of a material having non-flame retardancy, has inferior flame retardancy characteristics with respect to the conditions for evaluating the flame retardancy characteristics in comparison with Comparative Embodiment 2 in which all the adhesive layers in the cover member are made of a flame-retardant material.

In particular, it can be seen that in the case of Comparative Embodiment 1, the peak time for which the peak value of the HRR is maintained is 32.6 seconds, and the combustion is performed within a period of time shorter than 77 seconds that is the peak time in Comparative Embodiment 2.

That is, the embodiments of the present specification may provide the cover member including all the thin plate glass with the thickness having flame retardancy and the flame-retardant film layer and the adhesive layer made of a material having flame retardancy, thereby providing the flexible display apparatus with the significantly improved flame retardancy.

The exemplary embodiments of the present disclosure can also be described as follows:

According to an aspect of the present disclosure, a flexible display apparatus is disclosed. The flexible display apparatus includes a flexible substrate including a display area and a non-display area. The flexible display apparatus further includes an organic light-emitting element disposed on the flexible substrate. The flexible display apparatus further includes a cover member on the organic light-emitting element, the cover member including at least one plate glass layer including a thin plate glass and an adhesive layer configured to cover the plate glass. The thin plate glass has a cusp at a lateral portion.

The lateral portion may include: a first inclined surface configured to connect an edge of a top surface of the thin plate glass to the cusp, the first inclined surface inclined at a first angle with respect to a horizontal plane passing through the cusp; and a second inclined surface configured to connect an edge of a bottom surface of the thin plate glass to the cusp, the second inclined surface inclined at a second angle which is different from the first angle with respect to the horizontal plane.

The first angle and the second angle are acute angles, and the first angle is greater than the second angle.

A second vertical height between the horizontal plane and the bottom surface of the thin plate glass may be shorter than a first vertical height between the horizontal plane and the top surface of the thin plate glass.

A ratio of the first vertical height and the second vertical height may be in a range of 6:4 to 8:2.

The ratio of the first vertical height of the thin plate glass and the second vertical height of the thin plate glass may be 7:3.

The adhesive layer may cover a top surface of the thin plate glass and the lateral portion thereof.

The adhesive layer may have a modulus of greater than $1.0 \times 10^6$ Pa.

A thickness of the thin plate glass is 100 μm or less.

The flexible display apparatus may further include a shatterproof layer on the plate glass, and a hard coating layer on the shatterproof layer. The adhesive layer is disposed between the shatterproof layer and the thin plate glass.

The shatterproof layer may have a pencil hardness of greater than 6H.

The thin plate glass may have a thickness in a range of 70 μm to 90 μm.

The adhesive layer may have a thickness in a range of 5 μm to 15 μm.

The shatterproof layer may have a thickness in a range of 30 μm to 50 μm.

The hard coating layer may have a thickness in a range of 10 μm to 40 μm.

The thin plate glass may be a chemically strengthened glass.

A thickness of the thin plate glass may be in a range of 100 µm to 350 µm and have flame retardancy.

The flexible display apparatus may further include a flame-retardant film layer on the thin plate glass, and a hard coating layer on the flame-retardant film layer. The adhesive layer is disposed between the flame-retardant film layer and the thin plate glass.

The flame-retardant film layer may be made of a transparent material having a limiting oxygen index of 27 or more.

The flame-retardant film layer may include a polyimide-based material or a polycarbonate-based material.

A thickness of the flame-retardant film layer is 25 µm or more.

The adhesive layer may be made of a transparent material having a limiting oxygen index of 27 or more.

The adhesive layer may include a polysiloxane-based material.

A thickness of the adhesive layer disposed between the flame-retardant film layer and the thin plate glass may be in a range of 25 µm to 100 µm.

The flexible display apparatus may further include an adhesive layer disposed between the thin plate glass and the organic light-emitting element. A thickness of the adhesive layer disposed between the thin plate glass and the organic light-emitting element is in a range of 25 µm to 300 µm.

The cover member may include a first thin plate glass layer, and a second thin plate glass layer on an upper portion of the first thin plate glass layer. The first thin plate glass layer and the second thin plate glass layer each include the thin plate glass and the adhesive layer.

A thickness of the thin plate glass included in each of the first and second thin plate glass layers is 200 µm to 350 µm.

A thickness of the adhesive layer included in each of the first and second thin plate glass layers is 25 µm to 100 µm.

The flexible display apparatus may further comprise: a backplate disposed under the flexible substrate; a plate assembly disposed under the backplate; and an optical control layer disposed between the organic light-emitting element and the cover member.

The flexible substrate may comprise a display area and a non-display area, the flexible display apparatus may further comprise a black matrix layer, the black matrix layer is formed on a top surface or a bottom surface of the thin plate glass corresponding to the non-display area.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A flexible display apparatus comprising:
a flexible substrate including a display area and a non-display area;

an organic light-emitting element on the flexible substrate; and
a cover member on the organic light-emitting element, the cover member comprising:
at least one plate glass layer including a plate glass and an adhesive layer that covers the plate glass,
wherein the plate glass has a cusp on a lateral portion of the plate glass.

2. The flexible display apparatus of claim 1, wherein the lateral portion includes:
a first inclined surface configured to connect an edge of a top surface of the plate glass to the cusp, the first inclined surface inclined at a first angle with respect to a horizontal plane passing through the cusp; and
a second inclined surface configured to connect an edge of a bottom surface of the plate glass to the cusp, the second inclined surface inclined at a second angle which is different from the first angle with respect to the horizontal plane.

3. The flexible display apparatus of claim 2, wherein the first angle and the second angle are acute angles, and the first angle is greater than the second angle.

4. The flexible display apparatus of claim 2, wherein a second vertical height between the horizontal plane and the bottom surface of the plate glass is shorter than a first vertical height between the horizontal plane and the top surface of the plate glass.

5. The flexible display apparatus of claim 1, wherein the adhesive layer covers a top surface of the plate glass and the lateral portion thereof.

6. The flexible display apparatus of claim 1, wherein the adhesive layer has a modulus of greater than $1.0 \times 10^6$ Pa.

7. The flexible display apparatus of claim 1, wherein a thickness of the plate glass is 100 µm or less.

8. The flexible display apparatus of claim 7, further comprising:
a shatterproof layer on the plate glass; and
a hard coating layer on the shatterproof layer,
wherein the adhesive layer is between the shatterproof layer and the plate glass.

9. The flexible display apparatus of claim 8, wherein the shatterproof layer has a pencil hardness of greater than 6H.

10. The flexible display apparatus of claim 1, wherein a thickness of the plate glass is in a range of 100 µm to 350 µm and has flame retardancy.

11. The flexible display apparatus of claim 10, further comprising:
a flame-retardant film layer on the plate glass; and
a hard coating layer on the flame-retardant film layer,
wherein the adhesive layer is between the flame-retardant film layer and the plate glass.

12. The flexible display apparatus of claim 11, wherein the flame-retardant film layer comprises a transparent material having a limiting oxygen index of 27 or more.

13. The flexible display apparatus of claim 11, wherein the flame-retardant film layer includes a polyimide-based material or a polycarbonate-based material.

14. The flexible display apparatus of claim 11, wherein the adhesive layer comprises a transparent material having a limiting oxygen index of 27 or more.

15. The flexible display apparatus of claim 11, wherein the adhesive layer includes a polysiloxane-based material.

16. The flexible display apparatus of claim 11, wherein a thickness of the adhesive layer between the flame-retardant film layer and the plate glass is in a range of 25 µm to 100 µm.

17. The flexible display apparatus of claim 16, further comprising:

an adhesive layer between the plate glass and the organic light-emitting element, wherein a thickness of the adhesive layer between the plate glass and the organic light-emitting element is in a range of 25 μm to 300 μm.

18. The flexible display apparatus of claim 10, wherein the cover member comprises:

a first plate glass layer; and a second plate glass layer on an upper portion of the first plate glass layer, wherein the first plate glass layer and the second plate glass layer each include a respective plate glass and a respective adhesive layer.

19. The flexible display apparatus of claim 18, wherein a thickness of the respective plate glass included in each of the first plate glass layer and the second plate glass layer is in a range of 200 μm to 350 μm.

20. The flexible display apparatus of claim 1, further comprising:

a backplate under the flexible substrate;

a plate assembly under the backplate;

an optical control layer between the organic light-emitting element and the cover member; and a black matrix layer on a top surface or a bottom surface of the plate glass corresponding to the non-display area.

\* \* \* \* \*